United States Patent [19]

Vandegraaf

[11] Patent Number: 4,498,194
[45] Date of Patent: Feb. 5, 1985

[54] MULTIFREQUENCY SCANNING RECEIVER WITH PRIORITY FREQUENCY MONITORING

[75] Inventor: Johannes J. Vandegraaf, Lynchburg, Va.

[73] Assignee: General Electric Company, Lynchburg, V.I.RGINIA

[21] Appl. No.: 462,313

[22] Filed: Jan. 31, 1983

[51] Int. Cl.³ .......................... H03J 7/20; H04B 1/26
[52] U.S. Cl. .................................................. 455/166
[58] Field of Search ........................ 455/166, 165, 161

[56] References Cited

U.S. PATENT DOCUMENTS 3,619,788 11/1971 Giles, Jr. et al. .................. 455/166
3,750,032  7/1973 Andrews ............................ 455/166
4,009,442  2/1977 Von Brömssen .................. 455/166
4,069,455  1/1978 Sherman, Jr. ..................... 455/166
4,430,753  2/1984 Shiratani ........................... 455/166

Primary Examiner—Marc E. Bookbinder
Attorney, Agent, or Firm—James J. Williams; Robert C. Lampe, Jr.

[57] ABSTRACT

A scanning receiver is provided with a pause detector which causes the receiver to tune to a priority channel during pauses in the transmission on a nonpriority channel. If a priority transmission is present, the receiver remains on the priority channel until the priority transmission ends. If no priority transmission is present, the receiver is tuned back to the former nonpriority channel.

10 Claims, 3 Drawing Figures

MULTIFREQUENCY SCANNING RECEIVER WITH PRIORITY FREQUENCY MONITORING

BACKGROUND OF THE INVENTION

My invention relates to a multifrequency scanning radio receiver, and particularly to such a receiver that monitors a priority radio frequency while a nonpriority radio frequency signal is being received.

Scanning radio receivers are used to monitor a plurality of radio frequencies or channels. Often, one radio channel is designated the priority channel which should always be monitored for priority or important information. This priority monitoring has been achieved by a circuit or arrangement described in U.S. Pat. No. 3,619,788. In that arrangement, a scanning receiver is recurringly switched between radio channels until a signal is received, at which time the receiver is held on that channel for the duration of the signal. If the receiver is held on a nonpriority channel, a circuit is actuated to sample the priority channel repeatedly to determine whether a signal is present on the priority channel. If a priority channel signal is present during the sampling interval, the receiver is then held on the priority channel so that priority information will be heard, in spite of the fact that there was a signal on the nonpriority channel.

Such an arrangement works satisfactorily, particularly if crystal oscillators are used. Such oscillators permit rapid switching between channels in the order of ten milliseconds every 300–500 milliseconds. Such switching times do not cause significant distortion or deterioration in the speech quality of a signal being received. If a large number of channels must be monitored, it is more practical and economical to use a frequency synthesizer instead of a plurality of crystal oscillators. However, the limited bandwidth of the frequency synthesizer control circuit makes it quite difficult to achieve a settled synthesizer frequency to within two Kilohertz of the final desired frequency in less than 20 milliseconds. It is therefore very desirable to have a multifrequency monitoring arrangement that permits longer interruption periods so that frequency synthesizers can be used without causing noticeable distortion or deterioration in the quality of speech or information during channel switching.

SUMMARY OF THE INVENTION

In accordance with my invention, I provide an arrangement which periodically looks for pauses in the information or speech being received on each nonpriority channel, and which switches the receiver frequency to the priority channel in response to a pause being detected. If information or speech is present on the priority channel, the receiver remains tuned to the priority channel until the information or speech ends. If no information or speech is present on the priority channel, the receiver is switched back to the nonpriority channel. Switching to the priority channel during information or speech pauses permits frequency synthesizers, with all of their advantages, to be used without appreciable loss or deterioration of information or speech being received.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

DESCRIPTION OF THE PREFERRED EMBODIMENT-FIG. 1

Figure 1:
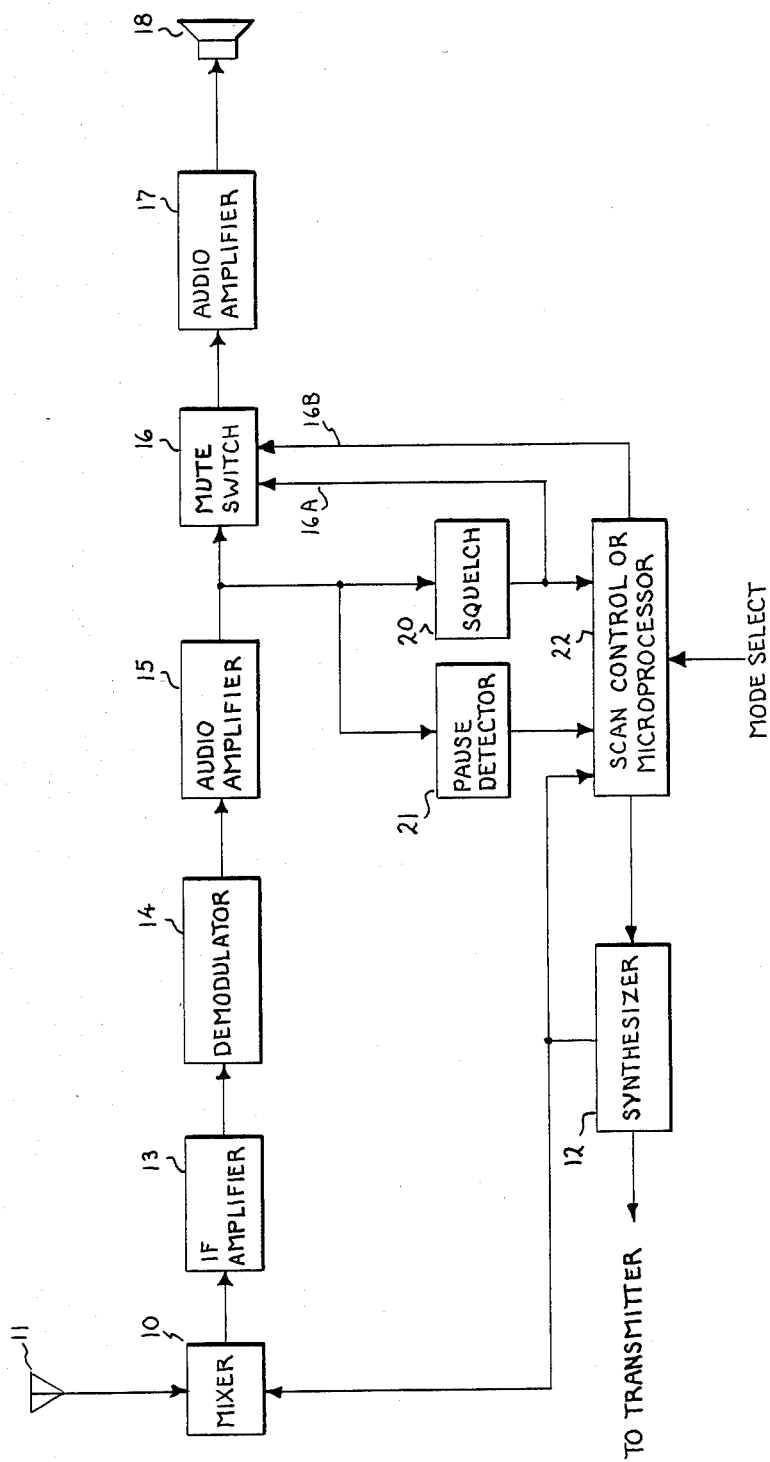
FIG. 1 shows a block diagram of a multifrequency scanning receiver in accordance with my invention.

In FIG. 1, I have shown a scanning receiver which I have assumed is intended to receive frequency modulation signals. However, my invention is equally applicable to other types of receivers, such as amplitude modulation. The receiver of FIG. 1 includes a mixer 10 which may be preceded by RF amplification. The mixer 10 is supplied with signals from an antenna 11 and from a frequency synthesizer 12 to produce an intermediate frequency which is amplified in an amplifier 13. The output of the synthesizer 12 can also be utilized in a radio transmitter if such a transmitter is provided with the receiver. The intermediate frequency is then detected or demodulated in a demodulator 14 to produce audible signals that are amplified in an amplifier 15. The amplified signals 15 are applied to a mute switch 16 which passes or blocks the audio signals in accordance with control signals at control inputs 16A, 16B. The output of the mute switch 16 is applied to an audio amplifier 17, which in turn is coupled to a utilization device such as the loudspeaker 18. The output of the audio amplifier 15 is also applied to a squelch circuit 20 which produces a squelch signal in the absence of radio frequency signals, and an unsquelch signal in the presence of radio frequency signals. The output of the squelch circuit is applied to the control input 16A of the mute switch 16 to cause the switch 16 to block audio signals if a squelch signal is produced, and to pass audio signals if an unsquelch signal is produced.

The circuit as described thus far is known in the art. As shown in previously mentioned U.S. Pat. No. 3,619,788, such a receiver scans a plurality of radio channels with crystal oscillators in place of the synthesizer 12 to cause the receiver to receive signals on the various radio channels.

In accordance with my invention, I provide a pause detector 21 whose input is connected to the output of the audio amplifier 15, and whose output is connected to a scan control or microprocessor circuit 22. The pause detector 21 may be any type of circuit which senses the presence or absence of audio signals, either speech or other types of information, and produces a first output in response to such speech or information, and which produces a second output in the absence of (or pause in) such speech or information. For example, the detector 21 could be a rectifier and filter circuit followed by an inverter which produces no voltage in the presence of speech or information, and produces a voltage in the absence of (or pause in) speech or information. Since the input to the pause detector 21 is ahead of the mute switch 16, channel noise in the absence of a radio frequency signal will be indicated as no pause. Only a quiet channel with no speech or information will be indicated as a pause. The scan control or microprocessor circuit 22 may be any type of computing device which causes the synthesizer 12 to periodically and sequentially switch frequencies so that the receiver can monitor all channels. The microprocessor circuit 22 has an output applied to the control input 16B to block audio signals when switching takes place to prevent noise from being heard. In addition, the circuit 22 causes the synthesizer 12 to stop scanning in response to an unsquelch signal being produced by the squelch circuit 20. If scanning is stopped on a nonpriority channel, the circuit 22 then looks for pause signals from the detector 21 to cause the synthesizer 12 to switch the receiver frequency to the priority channel. If no priority signal is present as indicated by a squelch signal, the circuit 22 causes the receiver to go back to the previously monitored nonpriority channel. If a signal is present on the priority channel, as indicated by an unsquelch signal, the circuit 22 holds the receiver on the priority channel until the priority signal has ended. And finally, the circuit 22 may be provided with a mode select input which permits a user to manually switch and hold the receiver on any desired channel, or which permits the receiver to scan the channels automatically.

DESCRIPTION OF THE PREFERRED EMBODIMENT-FIG. 2

As known in the art, a microprocessor circuit may be programmed to provide almost any desired function. When programmed in accordance with my invention, the microprocessor circuit 22 operates as explained in the flow diagram or chart of FIG. 2. A turn on signal is supplied to the receiver, and as indicated by the block 30, the microprocessor 22 determines whether the receiver is in the scan mode or not. If the receiver is not in the scan mode, the desired channel is manually selected as shown by the block 31. If the receiver is in the scan mode, the microprocessor 22 causes the synthesizer 12 to sequentially scan the channels as indicated by the block 32. During scan, as indicated by the block 33, if a signal is not detected as indicated by an unsquelch signal from the circuit 20, a release signal permits scanning to continue. The time required or desirable for a scan (i.e. switching to a different channel, detecting the absence of a signal, and switching to another channel) may vary, but should be in the order of 50 milliseconds in order to let the various circuits become sufficiently stable for a reliable operation. If a signal is received or detected as indicated by an unsquelch signal, a hold signal is provided to the scanning function block 32 to maintain reception on the frequency on which a signal is received. In response to a detected signal, an indication is obtained or a determination is made by the block 34 as to whether the receiver is on the priority channel or not. Such a determination can be made by sensing when the synthesizer 12 produces the proper frequency for the priority channel, or by proper tracking of the scanning signals supplied to the synthesizer 12. If the receiver is on the priority channel, the status is maintained, and the priority channel is monitored until the circuit 22 produces a squelch signal that indicates the transmission has ended so that scanning can resume.

However, if the receiver is not on a priority channel, a timing period TP followed by a pause window PW is started as indicated by the block 35. This timing period TP may be any suitable time duration, such as 250 milliseconds, and the pause window PW may be any suitable time duration, such as 250 milliseconds. After the end of the timing period TP, and during the pause window PW, a determination is made, as indicated by the block 36, as to whether a pause, indicated by the detector 21, occurs in the speech or transmission. If such a pause is detected, the microprocessor 22 causes the synthesizer 12 to immediately switch reception to the priority channel as indicated by the block 37. However, if no pause is detected during the pause window PW, then switching to the priority channel is made at the end of the pause window PW as also indicated by the block 37. After switching to the priority channel, the microprocessor 22 then determines whether a signal is detected as indicated by the block 38. If a signal is detected, the block 37 holds the receiver on the priority channel. At the end of the detected priority signal, or if no priority signal is detected, the receiver is switched back to the former nonpriority channel which had a signal. This is achieved by the block 39. If the former nonpriority channel no longer has a signal on it, block 33 releases block 32 for scanning. If the former nonpriority channel still has a signal on it, reception continues on that nonpriority channel and the timing period TP and pause window PW are started again. This operation is continued, with periodic switches to the priority channel either during a pause window PW or at the end of a pause window PW if no pause is detected. At the end of the nonpriority signal, scanning for another signal is resumed.

DESCRIPTION OF THE PREFERRED EMBODIMENT-FIG. 3

Figure 2:
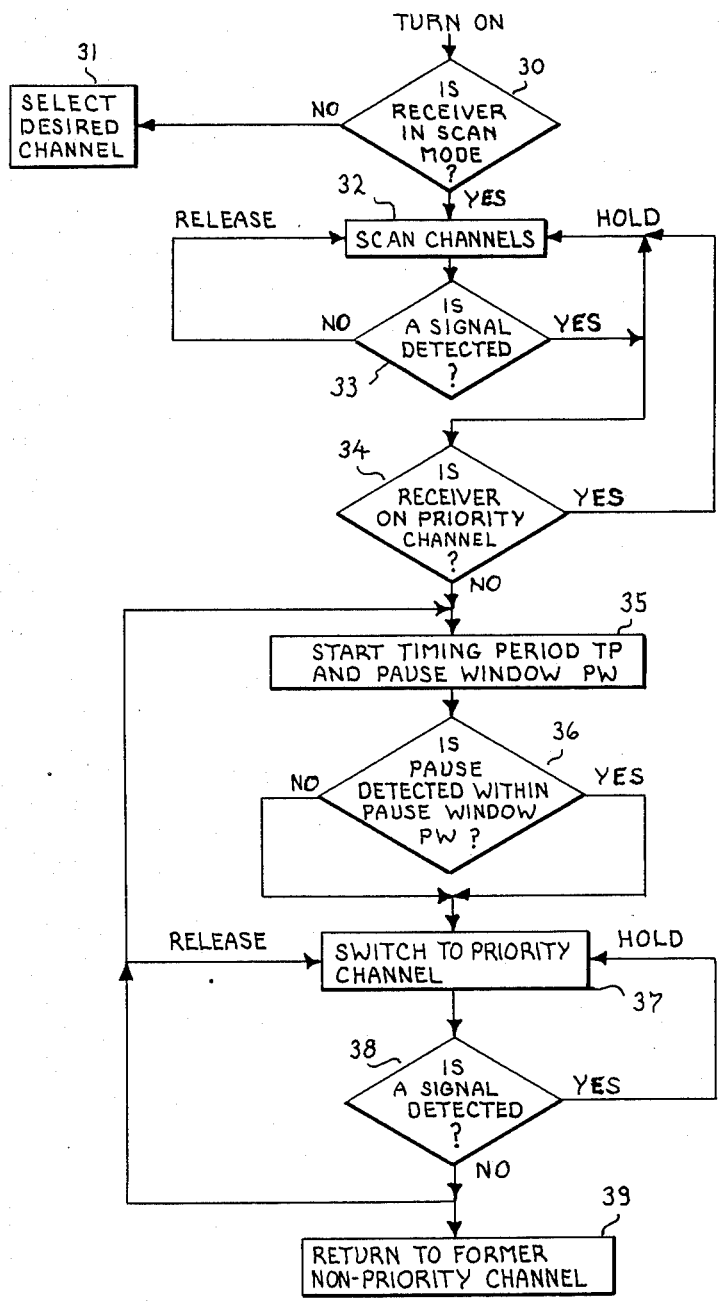
FIG. 2 shows a flow diagram illustrating the operation of the scanning control or microprocessor used in the receiver of FIG. 1 in accordance with my invention.
Figure 3:
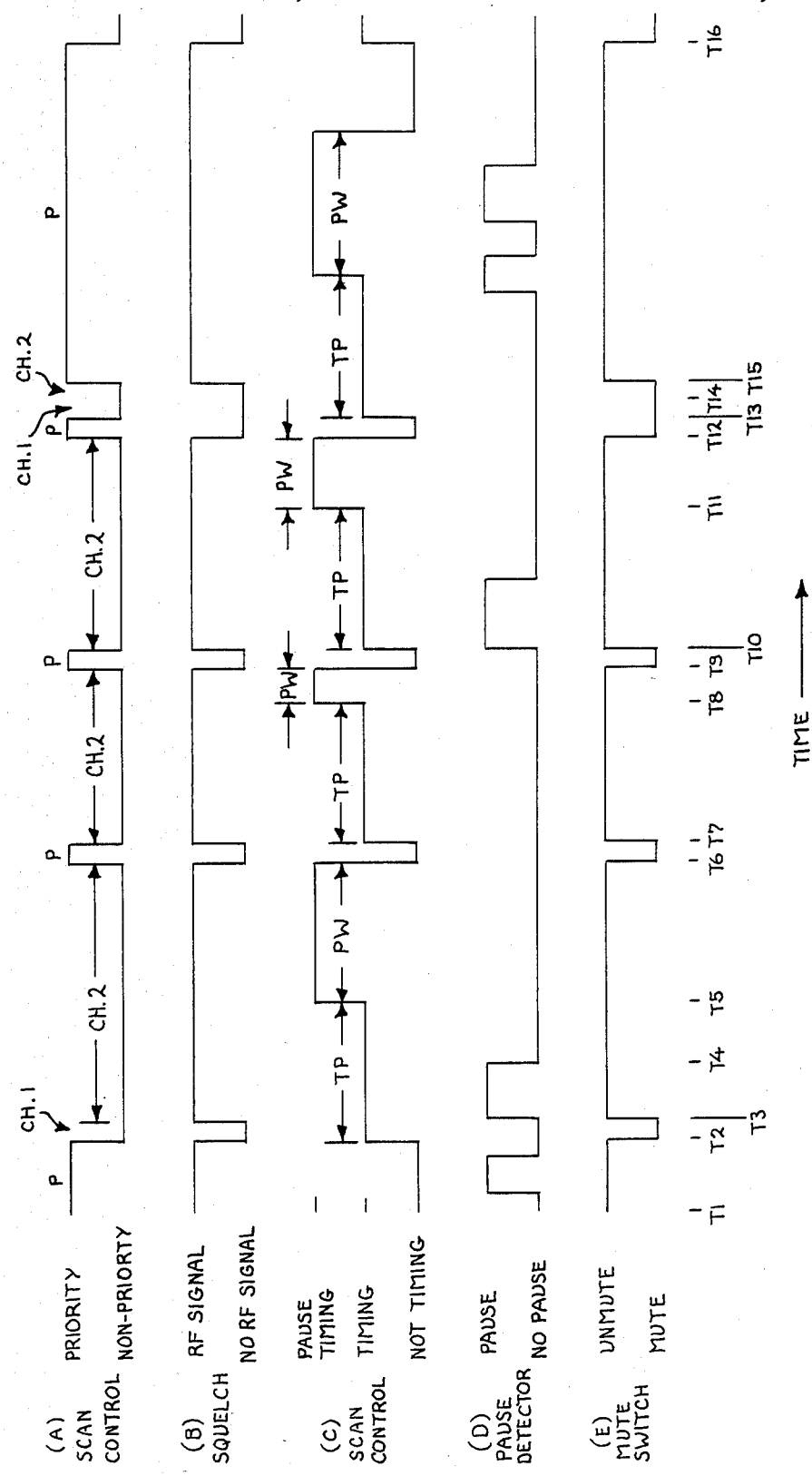
FIGS. 3A through 3E show waveforms illustrating the operation of my invention.

The operation of the receiver of FIG. 1 as exemplified by the flow diagram of FIG. 2 is explained in connection with the wave forms of FIG. 3 which are plotted along a common time axis. In FIG. 3, I have assumed that the receiver of FIG. 1 scans two nonpriority channels 1 and 2 and a priority channel P. FIG. 3A shows the signal from the microprocessor 12 which controls the channel being scanned or received. FIG. 3B shows the output of the squelch circuit 20, indicating whether a radio frequency (RF) signal is present or not. FIG. 3C shows the internal timing of the microprocessor 22, namely whether the circuit 22 is not timing, or whether it is in the timing period TP, or in the timed pause window PW. FIG. 3D shows the output of the pause detector 21; and FIG. 3E shows whether the mute switch 16 mutes or blocks audio signals, or unmutes and passes audio signals. At the initial time T1, I have assumed that the receiver is tuned to and receiving transmission on the priority channel P as indicated in FIG. 3A. The squelch circuit shows that an RF signal is present as indicated in FIG. 3B. The scan control is not timing as indicated in FIG. 3C. And as indicated in FIG. 3D, the pause detector shows that there are pauses and no pauses in the priority information or speech signal. However, because the receiver is tuned to the priority channel, I prefer that such pauses do not affect the operation. And FIG. 3E shows that the receiver is unmuted to receive audio signals.

At the time T2, I assume that the priority signal terminates and scanning resumes with nonpriority channel 1. When the receiver is tuned to channel 1, I have assumed that no radio frequency signal is present as shown in FIG. 3B. This starts the scan control timing period TP as shown in FIG. 3C. At the time T2, with no radio frequency signal on channel 1, the receiver is muted as seen in FIG. 3E. There appears or seems to be no pause as shown in FIG. 3D, because of the noise on channel 1. Since no radio signal is present on channel 1, the scan control causes the receiver to tune to channel 2 at the time T3. I have assumed that a radio signal is present on channel 2, and that there is a pause at that moment. Because of the radio signal, the receiver unmutes as indicated in FIG. 3E. At the time T4, a voice or information signal appears on channel 2, so that no pause output is produced as shown in FIG. 3D. The information or voice transmission continues through the timing period TP which ends at the time T5 and at which time the pause window PW begins. At the end of the full pause window PW and the time T6, there has still been no pause, so that the scan control causes switching to the priority channel P as indicated in FIG. 3A. No signal is present on the priority channel, so that the scan control causes the receiver to be tuned back to channel 2. This initiates a new timing period TP at the time T7. Again, I have assumed that the user of channel 2 is talking almost continuously, so that no pause signal is produced during the timing period TP and until the beginning of the pause window PW at the time T8. However, before the end of the pause window PW (which began at the time T8), I assume that at the time T9 there is a pause on channel 2. This causes the synthesizer to tune the receiver to the priority channel P as indicated in FIG. 3A. If a priority signal were present, the receiver would remain on the priority channel P until the priority signal ends. But again, I have assumed that no radio signal is present on the priority channel P, so that the synthesizer is switched back again to channel 2 to initiate a new timing period TP at the time T10. I also assume that there is a pause on channel 2 at this time. This pause has no effect on the scanning, as the pause window PW has not started. This timing period TP ends at the time T11 and the pause window PW begins. At the time T12, I assume that the user of channel 2 ends transmission on channel 2, and this again causes the synthesizer to switch to the priority channel as shown in FIG. 3A. Again, I have assumed that there is no priority signal present, so that the receiver is then tuned to channel 1 at the time T13. This starts the timing period TP as shown in FIG. 3C. I assume that there is no transmission on channel 1, so that the receiver is then tuned to channel 2 at the time T14. I also assume that there is no signal on channel 2, so that the receiver is tuned to the priority channel P at the time T15. At this time, a priority signal is detected as indicated in FIG. 3A. This causes the receiver to unmute so that speech or information can be heard. During reception of the priority channel P, the previously started timing period TP and the pause window PW continue as shown in FIG. 3C, but the microprocessor 22 is not affected even though there are pauses in the priority channel as indicated in FIG. 3D. The receiver remains on the priority channel P until its transmission ends at the time T16. When this occurs, operation and scanning of channel 1 and channel 2 is started again.

Although the waveforms of FIG. 3 do not illustrate all conditions or possible operations, persons skilled in the art will understand such possibilities from the diagram of FIG. 2. For example, if there had been a nonpriority transmission on channel 2 prior to the priority transmission at the time T1, then the receiver would have been tuned back to channel 2 at the time T1 to receive any transmission which might still have been present on channel 2.

CONCLUSION

It will thus be seen that I have provided a new and improved arrangement for use in scanning receivers that permits scanning to be achieved with a frequency synthesizer by the use of a pause detector or similar device to cause switching to a priority channel to take place as much as possible during pauses on the nonpriority channels. While I have shown only one embodiment of my invention, persons skilled in the art will appreciate the many modifications that may be made. For example, the actual times of the timing period TP and the pause window PW may be modified as desired or as practical in a given installation. The timing period TP may be restarted each time a switch is made to another nonpriority channel, instead of only at the first switch to a nonpriority channel, if there are not too many nonpriority channels to be scanned. The timing period TP may be eliminated or reduced, so that switching to the priority channel takes place at any time during the duration of the pause window PW only. And, as long as the pause detector or the pause window are used, some changes may be made in the diagram of FIG. 2. My circuit can also be used with switched crystal oscillators, although my circuit has greater desirability with a synthesizer. Therefore, while my invention has been described with reference to a particular embodiment, it is to be understood that modifications may be made without departing from the spirit of the invention or from the scope of the claims.

What I claim as new and desire to secure by Letters Patent of the United States is:

1. In a scanning radio receiver having a microprocessor for causing the receiver to switch reception to each of a plurality of radio frequency channels, one of which is a priority channel and the others of which are nonpriority channels, and for stopping said switching in response to reception of a radio frequency signal, the improvement comprising:
    detector means coupled to the microprocessor for detecting the disappearance of a basebond information signal on a nonpriority channel and signalling the microprocessor to switch reception to said priority channel.

2. The improved radio receiver of claim 1 further comprising a squelch circuit for detecting the presence of a received signal on a radio frequency channel and for sending a control signal to the microprocessor to switch channels in the absence of said received signal on said radio frequency channel.

3. The improved radio receiver of claim 1 wherein said detector means is a pause detector and the disappearance of said basebond information signal is a pause in a voice signal.

4. The improved radio receiver of claim 2 wherein said detector means is a pause detector and the disappearance of said basebond information signal is a pause in a voice signal.

5. The improved radio receiver of claim 1 in which said microprocessor provides a period during which said detector means can detect the disappearance of said basebond information signal, and after which said microprocessor causes switching to said priority channel if the disappearance has not been detected during said period.

6. The improved radio receiver of claim 5 wherein said microprocessor further causes the receiver to switch reception back to said nonpriority channel being received in response to the absence of a signal on said priority channel.

7. The improved radio receiver of claim 6 wherein said detector means is a pause detector and the disappearance of said basebond information signal is a pause in a voice signal.

8. An improved radio scanning receiver comprising:
   a. a mixer having a radio frequency signal input and a radio frequency synthesizer input for producing an intermediate frequency output therefrom;
   b. a demodulator coupled to said mixer output through an intermediate frequency amplifier for producing audio output therefrom;
   c. a radio frequency synthesizer having a channel control input coupled to a microprocessor output and an output whose frequency is determined by said channel control input;
   d. a squelch circuit coupled to said demodulator for detecting the presence of a radio frequency signal input to the receiver;
   e. a microprocessor for providing said channel control input to said synthesizer to cause said receiver to scan each of a plurality of radio channels, at least one of which is a priority channel and the others of which are nonpriority channels, for stopping said scanning in response to said sensed channel, and for determining whether said channel signal is a priority channel signal and, in response to determination of said priority channel signal, remaining on said priority channel for the duration of said priority channel signal; and
   f. a pause detector responsive to said demodulator output and coupled to the microprocessor for detecting the disappearance of an audio information signal on a nonpriority channel and signalling the microprocessor to switch reception to said priority channel.

9. The improved radio scanning receiver of claim 8 wherein said microprocessor causes production of said priority channel signal after a predetermined time period following determination that the channel signal is a nonpriority channel signal.

10. The improved radio scanning receiver of claim 8 wherein, if said microprocessor has previously switched from an active nonpriority channel to a priority channel, said microprocessor will thereafter switch the receiver back to the active nonpriority channel in the absence of a priority signal.

* * * * *